US009048406B2

(12) United States Patent
Yamazaki et al.

(10) Patent No.: US 9,048,406 B2
(45) Date of Patent: Jun. 2, 2015

(54) CURABLE SILICONE COMPOSITION, CURED PRODUCT THEREOF, AND OPTICAL SEMICONDUCTOR DEVICE

(71) Applicant: Dow Corning Toray Co., Ltd., Tokyo (JP)

(72) Inventors: Ryosuke Yamazaki, Ichihara (JP); Makoto Yoshitake, Ichihara (JP)

(73) Assignee: DOW CORNING TORAY CO., LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 14/375,989

(22) PCT Filed: Feb. 1, 2013

(86) PCT No.: PCT/JP2013/052964
§ 371 (c)(1),
(2) Date: Jul. 31, 2014

(87) PCT Pub. No.: WO2013/115415
PCT Pub. Date: Aug. 8, 2013

(65) Prior Publication Data
US 2014/0367723 A1    Dec. 18, 2014

(30) Foreign Application Priority Data
Feb. 2, 2012    (JP) ................................ 2012-021279

(51) Int. Cl.
*H01L 33/60*    (2010.01)
*C08K 5/549*    (2006.01)
(Continued)

(52) U.S. Cl.
CPC .............. *H01L 33/60* (2013.01); *C08G 77/045* (2013.01); *C08G 77/12* (2013.01); *C08G 77/20* (2013.01);
(Continued)

(58) Field of Classification Search
None
See application file for complete search history.

(56) References Cited

U.S. PATENT DOCUMENTS 6,806,509 B2 * 10/2004 Yoshino et al. ............... 257/103
8,193,269 B2 * 6/2012 Taguchi et al. ............... 524/430
(Continued)

FOREIGN PATENT DOCUMENTS

JP    2009021394 A    1/2009
JP    2011140550 A    7/2011

OTHER PUBLICATIONS

English language abstract and machine-assisted English translation for JP2009021394 extracted from espacenet.com database on Oct. 1, 2014, 11 pages.
(Continued)

*Primary Examiner* — Robert S Loewe
(74) *Attorney, Agent, or Firm* — Howard & Howard Attorneys PLLC

(57) ABSTRACT

A curable silicone composition comprises: (A) an organopolysiloxane represented by an average unit formula; (B) an organopolysiloxane having 10 or less silicon atoms, wherein 30 to 60 mole % of all silicon atom-bonded organic groups are alkenyl groups having from 2 to 6 carbons; (C) an organopolysiloxane represented by a general formula; (D) an organopolysiloxane having at least 2 silicon atom-bonded hydrogen atoms in a molecule, wherein the content of phenyl groups in all silicon atom-bonded organic groups in this component is at least 20 mole %; (E) an organopolysiloxane having at least 2 silicon atom-bonded hydrogen atoms in a molecule, wherein the content of phenyl groups in all silicon atom-bonded organic groups in this component is less than 20 mole %; (F) a hydrosilylation reaction catalyst; (G) a white pigment; and (H) an inorganic filler other than a white pigment, has excellent formability for forming a cured product that has little discoloration and lowering of mechanical strength by heat and light, has high light reflectance, has excellent dimensional stability, and is capable of good attachment by a sealing agent used for an optical semiconductor device.

10 Claims, 1 Drawing Sheet

(51) Int. Cl.
  *C08L 83/04* (2006.01)
  *C08G 77/04* (2006.01)
  *C08G 77/12* (2006.01)
  *C08G 77/20* (2006.01)
  *C08G 77/00* (2006.01)

(52) U.S. Cl.
  CPC ............... *C08L 83/04* (2013.01); *C08G 77/80* (2013.01); *H01L 2224/32245* (2013.01); *H01L 2224/48091* (2013.01); *H01L 2224/48247* (2013.01); *H01L 2224/73265* (2013.01); *C08K 5/549* (2013.01)

(56) References Cited

U.S. PATENT DOCUMENTS

| | | | |
|---|---|---|---|
| 2004/0116640 A1* | 6/2004 | Miyoshi | 528/12 |
| 2006/0275617 A1* | 12/2006 | Miyoshi et al. | 428/448 |
| 2007/0042533 A1* | 2/2007 | Endo et al. | 438/118 |
| 2009/0118440 A1* | 5/2009 | Nakanishi et al. | 525/478 |
| 2009/0123764 A1* | 5/2009 | Morita et al. | 428/446 |
| 2009/0258216 A1* | 10/2009 | Yamakawa et al. | 428/323 |
| 2011/0058776 A1* | 3/2011 | Taniguchi et al. | 385/88 |
| 2011/0241048 A1* | 10/2011 | Taguchi et al. | 257/98 |
| 2012/0184663 A1* | 7/2012 | Hamamoto et al. | 524/500 |
| 2013/0082369 A1* | 4/2013 | Kokubo et al. | 257/666 |

OTHER PUBLICATIONS

English language abstract and machine-assisted English translation for JP2011140550 extracted from espacenet.com database on Oct. 1, 2014, 17 pages.

International Search Report for PCT/JP2013/052964 dated Jun. 17, 2013, 3 pages.

* cited by examiner

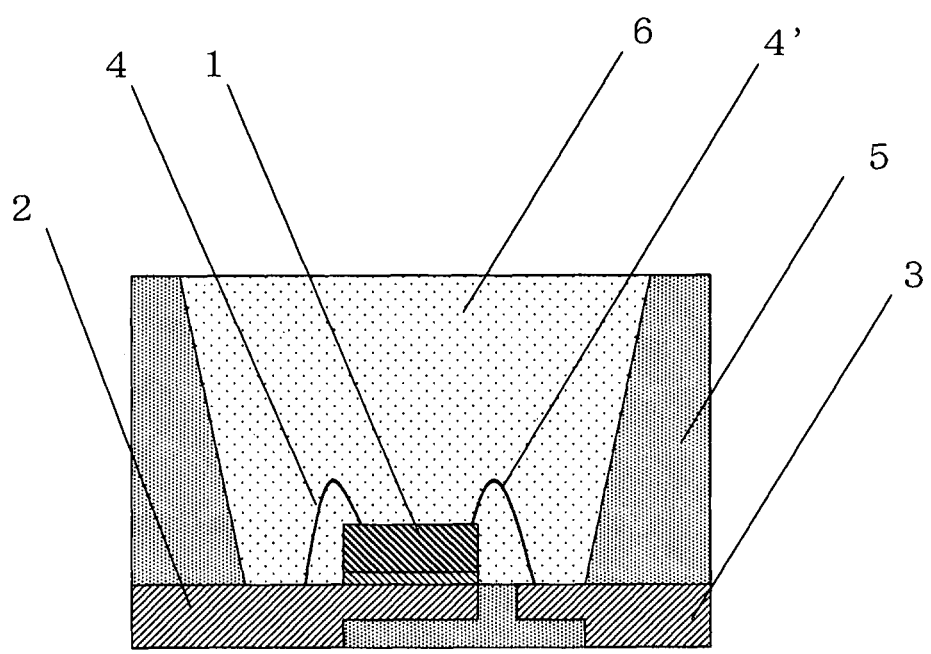

CURABLE SILICONE COMPOSITION, CURED PRODUCT THEREOF, AND OPTICAL SEMICONDUCTOR DEVICE

CROSS-REFERENCE TO RELATED APPLICATIONS

This application is the National Stage of International Patent Application No. PCT/JP2013/052964, filed on Feb. 1, 2013, which claims priority to and all the advantages of Japanese Patent Application No. 2012-021279, filed on Feb. 2, 2012, the content of which is incorporated herein by reference.

TECHNICAL FIELD

The present invention relates to a curable silicone composition, cured product thereof, and to an optical semiconductor device using the cured product as a light reflection material.

BACKGROUND ART

Curable silicone compositions that cure by a hydrosilylation reaction are used as protective agents, coating agents, lens-molding materials, light reflection materials, or the like for optical semiconductor elements in optical semiconductor devices such as photocouplers, light emitting diodes, solid-state imaging devices, or the like. Among these, the compositions used as light reflection materials can be exemplified by a resin composition for a mounting package that incorporates an optical semiconductor element, and comprises a thermosetting type addition reaction-capable silicone resin that has a structure where vinyl groups or allyl groups, and hydrogen atoms are directly bonded to silicon atoms, a platinum-type catalyst as a curing catalyst, and a white pigment (refer to Japanese Unexamined Patent Application Publication No. 2009-21394); and by an addition curable silicone resin composition comprises a vinyl-functional organopolysiloxane having a weight average molecular weight (Mw) greater than or equal to 30,000, an organohydrogenpolysiloxane having at least two silicon atom-bonded hydrogen atoms in a molecule, a white pigment; an inorganic filler other than the white pigment, a platinum metal-type catalyst; and a reaction inhibitor, wherein its cured product has a visible light average reflectance greater than or equal to 80% (refer to Japanese Unexamined Patent Application Publication No. 2011-140550).

These compositions have the following problems in transfer molding, injection molding, or compression molding: low mold filling, facile generation of voids and flashing, and/or a poor mold releasability; also, slow curing rate and a poor workability in the molding operation. In addition, although the cured products obtained by curing these compositions have the advantage of little discoloration by heat and light, the cured products have following problems of high linear expansion coefficients and/or a low mechanical strength at high temperature, as well as the problems of an insufficient light reflectance and great lowering of mechanical strength by heat or light. When such a composition is used to form a light reflection material in an optical semiconductor device, and when a sealing agent covers the optical semiconductor element, adhesion of the sealing agent to the light reflection material is poor.

An object of the present invention is to provide a curable silicone composition that has excellent moldability and that forms a cured product that has little discoloration and lowering of mechanical strength by heat and light, has high light reflectance, and has excellent dimensional stability. A further object of the present invention is to provide a cured product that has little discoloration and lowering of mechanical strength by heat and light, and has high light reflectance. A further object of the present invention is to provide an optical semiconductor device in which a sealing agent bonds well to a light reflection material.

DISCLOSURE OF INVENTION

The curable silicone composition of the present invention characteristically comprises:

(A) 100 parts by mass of an organopolysiloxane represented by the following average unit formula:

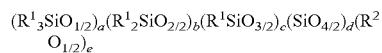

wherein $R^1$ are the same or different, and are phenyl groups, alkyl groups having from 1 to 6 carbons, or alkenyl groups having from 2 to 6 carbons, provided that 30 to 80 mole % of all $R^1$ are phenyl groups, and 5 to 20 mole % of all $R^1$ are alkenyl groups; $R^2$ is a hydrogen atom or alkyl group having from 1 to 6 carbons; and "a", "b", "c", "d", and "e" are numbers that respectively satisfy: $0 \leq a \leq 0.3$, $0 \leq b \leq 0.7$, $0.3 \leq c \leq 0.9$, $0 \leq d \leq 0.1$, $0 \leq e \leq 0.1$, and $a+b+c+d=1$;

(B) 5 to 50 parts by mass of an organopolysiloxane having 10 or less silicon atoms, wherein 30 to 60 mole % of all silicon atom-bonded organic groups in this component are alkenyl groups having from 2 to 6 carbons;

(C) 0 to 40 parts by mass of an organopolysiloxane represented by the following general formula:

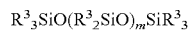

wherein $R^3$ are the same or different, and are phenyl groups, alkyl groups having from 1 to 6 carbons, or alkenyl groups having from 2 to 6 carbons, provided that 30 to 70 mole % of all $R^3$ are phenyl groups, and at least one $R^3$ is an alkenyl group; and "m" is an integer in a range from 10 to 100;

(D) an organopolysiloxane having at least 2 silicon atom-bonded hydrogen atoms in a molecule, wherein a content of phenyl groups in all silicon atom-bonded organic groups in this component is at least 20 mole %, in an amount that provides 0.3 to 1.5 moles of silicon atom-bonded hydrogen atoms in this component per 1 mole of the total amount of alkenyl groups in components (A) to (C);

(E) an organopolysiloxane having at least 2 silicon atom-bonded hydrogen atoms in a molecule, wherein a content of phenyl groups in all silicon atom-bonded organic groups in this component is less than 20 mole %, in an amount that provides 0.2 to 0.8 moles of silicon atom-bonded hydrogen atoms in this component per 1 mole of the total amount of alkenyl groups in components (A) to (C);

(F) a hydrosilylation reaction catalyst in a quantity sufficient to accelerate the hydrosilylation reaction between the alkenyl groups in components (A) to (C) and the silicon atom-bonded hydrogen atoms in components (D) and (E);

(G) a white pigment in an amount of at least 25 parts by mass per 100 parts by mass of the total amount of components (A) to (F); and (H) an inorganic filler other than a white pigment in an amount of at least 40 parts by mass per 100 parts by mass of the total amount of components (A) to (F), wherein the content of the total amount of components (G), and (H) is not more than 300 parts by mass per 100 parts by mass of the total amount of components (A) to (F).

Moreover, the cured product of the present invention is characteristically provided by curing the aforementioned curable silicone composition.

Furthermore, the optical semiconductor device of the present invention is characterized in comprising: an optical semiconductor element, a light reflection material for reflecting light emitted from the element, and a sealing agent for sealing the element that contacts the light reflection material; wherein the light reflection material is formed by a cured product of the aforementioned curable silicone composition.

Effects of Invention

The curable silicone composition of the present invention is characterized by an excellent moldability and upon curing characteristically forms a cured product that exhibits little discoloration or lowering of mechanical strength by heat or light, and has high light reflectance and excellent dimensional stability. Moreover, the cured product of the present invention characteristically exhibits little discoloration or lowering of mechanical strength by heat or light, and has high light reflectance. Furthermore, in the optical semiconductor device of the present invention, the sealing agent readily bonds to the light reflection material.

BRIEF DESCRIPTION OF THE DRAWINGS

FIG. 1 is a cross-sectional view of an LED as one example of the optical semiconductor device of the present invention.

DETAILED DESCRIPTION OF THE INVENTION

Firstly, the curable silicone composition of the present invention will be explained in detail.

Component (A) is the main component of the present composition and is an organopolysiloxane represented by the following average unit formula:

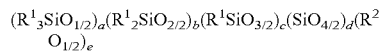

$(R^1{}_3SiO_{1/2})_a(R^1{}_2SiO_{2/2})_b(R^1SiO_{3/2})_c(SiO_{4/2})_d(R^2O_{1/2})_e$

In the formula, $R^1$ are the same or different, and are phenyl groups, alkyl groups having from 1 to 6 carbons, or alkenyl groups having from 2 to 6 carbons. Examples of the alkyl group of $R^1$ include methyl groups, ethyl groups, propyl groups, butyl groups, pentyl groups, hexyl groups, cyclopentyl groups, and cyclohexyl groups. Examples of the alkenyl group of $R^1$ include vinyl groups, allyl groups, butenyl groups, pentenyl groups, and hexenyl groups. In the formula, the content of phenyl groups in all $R^1$ is in a range from 30 to 80 mole %, and is preferably in a range from 40 to 70 mole %. When the content of phenyl groups is greater than or equal to the lower limit of the aforementioned range, mechanical strength of the obtained cured product is good. On the other hand, when the content of phenyl groups is less than or equal to the aforementioned upper limit, hardness of the obtained cured product is good at high temperature. Moreover, in the formula, the content of alkenyl groups in all $R^1$ is in a range from 5 to 20 mole %. When the content of alkenyl groups is greater than or equal to the lower limit of the aforementioned range, hardness of the obtained cured product at room temperature is good. On the other hand, when the content of alkenyl groups is less than or equal to the upper limit of the aforementioned range, mechanical strength of the obtained cured product is good.

Moreover, $R^2$ in the formula is a hydrogen atom or alkyl group having from 1 to 6 carbons. Examples of the alkyl group of $R^2$ include methyl groups, ethyl groups, propyl groups, butyl groups, pentyl groups, and hexyl groups.

Moreover, in the formula, "a" is a number indicating the fraction of siloxane units represented by the general formula: $R^1{}_3SiO_{1/2}$, and is a number satisfying: $0 \leq a \leq 0.3$, and preferably $0 \leq a \leq 0.25$. When the value of "a" is less than or equal to the aforementioned upper limit, hardness of the obtained cured product at room temperature is good. Moreover, "b" is a number indicating the fraction of siloxane units represented by the general formula: $R^1{}_2SiO_{2/2}$, and is a number satisfying: $0 \leq b \leq 0.7$, and preferably $0 \leq b \leq 0.6$. When the value of "b" is less than or equal to the aforementioned upper limit, hardness of the obtained cured product at room temperature is good. Moreover, "c" is a number indicating the fraction of siloxane units represented by the general formula: $R^1SiO_{3/2}$, and is a number satisfying: $0.3 \leq c \leq 0.9$, and preferably $0.35 \leq c \leq 0.85$. When the value of "c" is greater than or equal to the lower limit of the aforementioned range, hardness of the obtained cured product at room temperature is good. On the other hand, when the value of "c" is less than or equal to the upper limit of the aforementioned range, mechanical strength of the obtained cured product is good. Moreover, "d" is a number indicating the fraction of siloxane units represented by the general formula: $SiO_{4/2}$, and is a number satisfying: $0 \leq d \leq 0.1$. When the value of "d" is less than or equal to the upper limit of the aforementioned range, mechanical strength of the obtained cured product is good. Moreover, "e" is a number indicating the fraction of units represented by the general formula: $R^2O_{1/2}$, and is a number satisfying: $0 \leq e \leq 0.1$. When the value of "e" is less than or equal to the aforementioned upper limit, hardness of the obtained cured product at room temperature is good. Furthermore, the sum of "a", "b", "c", and "d" in the formula is 1.

Component (B) is a component used for improving handling and processability of the present composition and adjusting hardness of the obtained cured product. Component (B) is an organopolysiloxane having 10 or less silicon atoms, wherein 30 to 60 mole % of all silicon atom-bonded organic groups in this component are alkenyl groups having from 2 to 6 carbons. Examples of the alkenyl groups in component (B) include vinyl groups, allyl groups, butenyl groups, pentenyl groups, and hexenyl groups. Although no particular limitation is placed on the silicon-bonded organic group other than the alkenyl groups in component (B), this group is exemplified by methyl group and phenyl group, and preferably is methyl group. 30 to 60 mole % of all silicon atom-bonded organic groups are alkenyl groups having from 2 to 6 carbons. When the content of alkenyl groups is greater than or equal to the lower limit of the aforementioned range, hardness of the obtained cured product is good. On the other hand, when the content of alkenyl group is less than or equal to the upper limit of the aforementioned range, mechanical strength of the obtained cured product is good. Furthermore, the number of silicon atoms is less than or equal to 10. This is because viscosity of the composition is good when the number of silicon atoms is less than or equal to 10.

Examples of component (B) include 1,3,5,7-tetramethyl-1,3,5,7-tetravinylcyclotetrasiloxane, tetrakis(dimethylvinylsiloxy)silane, methyltris(dimethylvinylsiloxy)silane, and phenyltris(dimethylvinylsiloxy)silane.

The content of component (B) in the present composition, per 100 parts by mass of component (A), is in a range from 5 to 50 parts by mass, and is preferably in a range from 5 to 40 parts by mass. When the content of component (B) is greater than or equal to the lower limit of the aforementioned range, viscosity of the composition is good. On the other hand, when the content of component (B) is less than or equal to the upper limit of the aforementioned range, mechanical strength of the obtained cured product is good.

Component (C) is an optional component for adjusting viscosity of the present composition and for adjusting hardness and mechanical strength of the obtained cured product. Component (C) is an organopolysiloxane represented by the following general formula:

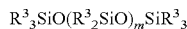

In the formula, $R^3$ are the same or different, and are phenyl groups, alkyl groups having from 1 to 6 carbons, or alkenyl groups having from 2 to 6 carbons.

Examples of the alkyl group of $R^3$ include methyl groups, ethyl groups, propyl groups, butyl groups, pentyl groups, hexyl groups, cyclopentyl groups, and cyclohexyl groups. Examples of the alkenyl group of $R^3$ include vinyl groups, allyl groups, butenyl groups, pentenyl groups, and hexenyl groups. In the formula, the content of phenyl groups in all $R^3$ is in a range from 30 to 70 mole %, and is preferably in a range from 40 to 60 mole %. When the content of phenyl groups is greater than or equal to the lower limit of the aforementioned range, mechanical strength of the obtained cured product is good. On the other hand, when the content of phenyl groups is greater than or equal to the aforementioned upper limit, hardness of the obtained cured product is good. Moreover, at least one $R^3$ is an alkenyl group. This component participates in the curing reaction when this component has at least one alkenyl group.

In the formula, "m" is an integer in a range from 10 to 100, and is preferably an integer in a range from 10 to 50. When "m" is greater than or equal to the lower limit of the aforementioned range, mechanical strength of the obtained cured product is good. On the other hand, when "m" is less than or equal to the upper limit of the aforementioned range, handling and processability of the obtained composition is good.

The content of component (C) in the present composition, per 100 parts by mass of component (A), is in a range from 0 to 40 parts by mass, and is preferably in a range from 0 to 20 parts by mass. When the content of component (C) is less than or equal to the aforementioned upper limit, hardness of the obtained cured product is good.

Component (D) is a first crosslinking agent of the present composition, and is an organopolysiloxane having at least 2 silicon atom-bonded hydrogen atoms in a molecule, wherein at least 20 mole % of all silicon atom-bonded organic groups in this component are phenyl groups. The number of the silicon atom-bonded hydrogen atoms in a molecule in component (D) is greater than or equal to 2. If this number of the silicon atom-bonded hydrogen atoms is present, crosslinking for curing is sufficient, and hardness of the obtained cured product is good. Examples of the silicon-bonded organic group in component (D) include a monovalent hydrocarbon group having no unsaturated aliphatic bond, as exemplified by an alkyl group such as a methyl group, ethyl group, propyl group, butyl group, pentyl group, hexyl group, heptyl group, cyclopentyl group, cyclohexyl group, cycloheptyl group, and the like; an aryl group such as a phenyl group, tolyl group, xylyl group, and the like; and an aralkyl group such as a benzyl group, phenethyl group, and the like. Of these, a phenyl group and an alkyl group having from 1 to 6 carbons are preferred. The content of phenyl groups in all silicon atom-bonded organic groups in component (D) is greater than or equal to 20 mole %, and is preferably from 20 to 70 mole %. When the content of phenyl groups is greater than or equal to the lower limit of the aforementioned range, mechanical strength of the obtained cured product at high temperature is good. On the other hand, when the content of phenyl groups is less than or equal to the aforementioned upper limit, mechanical strength of the obtained cured product is good.

Examples of component (D) include an organotrisiloxane represented by the following general formula:

a linear chain organopolysiloxane represented by the following general formula:

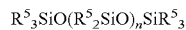

and a branched chain organopolysiloxane represented by the following average unit formula:

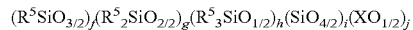

In the formula, $R^4$ are the same or different, and are phenyl groups or alkyl groups having from 1 to 6 carbons. Examples of the alkyl group of $R^4$ include methyl groups, ethyl groups, propyl groups, butyl groups, pentyl groups, hexyl groups, cyclopentyl groups, and cyclohexyl groups. The content of phenyl groups in all $R^4$ is greater than or equal to 20 mole %, and is preferably in a range from 20 to 70 mole %.

In the formula, $R^5$ are the same or different, and are hydrogen atoms, phenyl groups, or alkyl groups having from 1 to 6 carbons. At least two $R^5$ in the formula are hydrogen atoms. Examples of the alkyl group of $R^5$ include methyl groups, ethyl groups, propyl groups, butyl groups, pentyl groups, hexyl groups, cyclopentyl groups, and cyclohexyl groups. The content of phenyl groups in all $R^5$ except hydrogen atoms is greater than or equal to 20 mole %, and is preferably in a range from 20 to 70 mole %.

In the formula, "n" is an integer in a range from 5 to 1,000. In the formula, "f" is a positive number, "g" is 0 or a positive number, "h" is 0 or a positive number, "i" is 0 or a positive number, and "j" is 0 or a positive number. Also, the ratio "g/f" is a number in a range from 0 to 10. The ratio "h/f" is a number in a range from 0 to 5. The ratio "i/(f+g+h+i)" is a number in a range from 0 to 0.3. The ratio "j/(f+g+h+i)" is a number in a range from 0 to 0.4.

All of component (D) or the main component of component (D) is preferably an organotrisiloxane represented by the following general formula:

Content of this organotrisiloxane in component (D) is preferably at least 50% by mass.

The content of component (D) in the present composition is an amount such that the amount of silicon atom-bonded hydrogen atoms in this component, per 1 mole of the total amount of alkenyl groups in components (A) to (C), is from 0.3 to 1.5 moles, and is preferably from 0.5 to 1.2 moles. When the content of component (D) is within the aforementioned range, hardness of the obtained cured product is good.

Component (E) is a second crosslinking agent of the present composition, and is an organopolysiloxane having at least 2 silicon atom-bonded hydrogen atoms in a molecule, wherein the content of phenyl groups in all silicon atom-bonded organic groups in this component is less than 20 mole %. The number of the silicon atom-bonded hydrogen atoms in a molecule in component (E) is greater than or equal to 2. If this number of the silicon atom-bonded hydrogen atoms is present, crosslinking for curing is sufficient, and hardness of the obtained cured product is good. Examples of the silicon-bonded organic group in component (E) include a monovalent hydrocarbon group having no unsaturated aliphatic bond, as exemplified by an alkyl group such as a methyl group, ethyl group, propyl group, butyl group, pentyl group, hexyl group, heptyl group, cyclopentyl group, cyclohexyl group, cycloheptyl group, and the like; an aryl group such as a phenyl group, tolyl group, xylyl group, and the like; and an aralkyl group such as a benzyl group, phenethyl group, and the like. Of these, a phenyl group and an alkyl group having from 1 to 6 carbons are preferred. The content of phenyl groups in all silicon atom-bonded organic groups in component (E) is less than 20 mole %, and is preferably less than or equal to 10 mole %. Particularly preferably, at least 90 mole % of all silicon atom-bonded organic groups in component (E) are methyl groups. When the content of phenyl groups is less than the upper limit of the aforementioned range and particularly when the methyl group content is greater than or equal to the lower limit of the aforementioned range, adhesion of the obtained cured product toward various types of substrates is good, and adhesion of the sealing agent used for an optical semiconductor device to the cured product is good.

Examples of component (E) include a cyclic organopolysiloxane represented by the following formula:

wherein "Me" is a methyl group, and "p" is an integer in a range from 4 to 8, and linear chain organopolysiloxanes represented by the following general formulae:

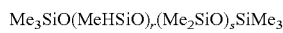

wherein "Me" is a methyl group; "q" is an integer greater than or equal to 5; "r" and "s" are respective integers greater than or equal to 5; and "r" is equal to or greater than "s".

The content of component (E) in the present composition is an amount such that the amount of silicon atom-bonded hydrogen atoms in this component, per 1 mole of total alkenyl groups in components (A) to (C), is from 0.2 to 0.8 moles, and is preferably from 0.3 to 0.7 moles. Adhesion of the sealing agent used for an optical semiconductor device to the obtained cured product becomes good when the content of component (E) is within the aforementioned range.

The total content of components (D) and (E) in the present composition, per 1 mole of total alkenyl groups in components (A) to (C), is preferably in a range such that the total silicon atom-bonded hydrogen atoms in components (D) and (E) is in a range from 0.5 to 2.0 moles, and particularly preferably in a range from 0.5 to 1.5 moles. When the total content of components (D) and (E) is within the aforementioned range, hardness of the obtained cured product is good.

Component (F) is a hydrosilylation reaction catalyst for accelerating the hydrosilylation reaction between the alkenyl groups in components (A) to (C) and the silicon atom-bonded hydrogen atoms in components (D) and (E). Examples of component (F) include platinum-type catalysts, rhodium-type catalysts, and palladium-type catalysts. Platinum-type catalysts are preferred due to the ability to remarkably accelerate curing of the composition. Examples of the platinum-type catalysts include platinum fine powder, chloroplatinic acid, alcoholic solutions of chloroplatinic acid, platinum-alkenylsiloxane complexes, platinum-olefin complexes, and platinum-carbonyl complexes. Platinum-alkenylsiloxane complexes are particularly preferred. Examples of the alkenylsiloxane include 1,3-divinyl-1,1,3,3-tetramethyldisiloxane, 1,3,5,7-tetramethyl-1,3,5,7-tetravinyl cyclotetrasiloxane, alkenylsiloxanes having part of the methyl groups of these alkenylsiloxane substituted by ethyl groups, phenyl groups, or the like, and alkenylsiloxanes having vinyl groups of these alkenylsiloxane substituted by allyl groups, hexenyl groups, or the like. 1,3-divinyl-1,1,3,3-tetramethyldisiloxane is particularly preferred due to high stability of the platinum-alkenylsiloxane complex. Due to the ability for improving the stability of the platinum-alkenylsiloxane complexes, combination is recommended of the platinum-alkenylsiloxane complexes with organosiloxane oligomers such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinyl cyclotetrasiloxane, or the like alkenylsiloxane, or dimethylsiloxane oligomers. The addition of alkenylsiloxanes is particularly preferred.

No particular limitation is placed on the content of component (F) in the composition as long as there is an amount sufficient to accelerate the hydrosilylation reaction between the alkenyl groups in components (A) to (C) and the silicon atom-bonded hydrogen atoms in components (D) and (E). However, this concentration in the present composition, in terms of mass units, based on the metal atoms in component (F), is preferably from 0.01 to 500 ppm, further is preferably from 0.01 to 100 ppm, and particularly is preferably from 0.01 to 50 ppm. When the content of component (F) is greater than or equal to the lower limit of the aforementioned range, the obtained composition exhibits an excellent cure. On the other hand, when the content of component (F) is less than or equal to the upper limit of the aforementioned range, the obtained cured product is resistant to discoloration.

Component (G) is a white pigment for coloring the cured product and composition of the present invention white and for increasing light reflectance. Preferred examples of component (G) include metal oxides such as titanium oxide, alumina, zinc oxide, zirconium oxide, magnesium oxide, and the like; barium sulfate, zinc sulfate, or the like; and titanium oxide and zinc oxide are particularly preferred.

Although no particular limitation is placed on the shape and the average particle diameter of component (G), the average particle diameter is preferably in a range from 0.05 to 10.0 μm, and further is preferably in a range from 0.1 to 5.0 μm. In order to increase the compatibility and dispersion ability of the white pigment with the resin and inorganic filler, the white pigment may be surface-treated using a silane coupling agent, silica, alumina, or the like.

The content of component (G) in the present composition, per 100 parts by mass of the total amount of components (A) to (F), is greater than or equal to 25 parts by mass, and is preferably greater than or equal to 30 parts by mass. Light reflectance of the cured product is good when the content of component (G) is greater than or equal to the lower limit of the aforementioned range.

Component (H) is an inorganic filler other than a white pigment for decreasing linear expansion coefficient of the cured product of the present invention, for improvement of dimensional stability, and for imparting appropriate viscosity to the composition. The inorganic filler of component (H) is exemplified by spherical silica, non-spherical silica, glass fiber, mica, and calcium carbonate. Examples of the spherical silica include dry-process silica, precipitated silica, fused silica, and pyrogenic silica. Examples of the spherical silica include quartz powder and glass beads. Examples of the glass fiber include chopped glass fibers and milled glass fibers.

Although no particular limitation is placed on average particle diameter of the inorganic filler of component (H), in the case of spheres, the average particle diameter is preferably in a range from 0.1 to 20 μm, and further is preferably in a range from 0.5 to 10 μm. In the case of fibers, fiber diameter is preferably in a range from 1 to 50 μm, and further preferably is in a range from 5 to 20 μm. Fiber length is preferably in a range from 5 to 500 μm, and further is preferably in a range from 10 to 300 μm.

The content of component (H) in the present composition, per 100 parts by mass of the total amount of components (A) to (F), is greater than or equal to 40 parts by mass, and is preferably greater than or equal to 50 parts by mass. Linear expansion coefficient of the obtained cured product is low and dimensional stability is good when the content of component (H) is greater than or equal to the lower limit of the aforementioned range.

The total content of components (G) and (H) in the present composition, per 100 parts by mass of the total amount of components (A) to (F), is less than or equal to 300 parts by mass, and is preferably less than or equal to 250 parts by mass. Viscosity of the obtained composition is good when the total content of components (G) and (H) is less than or equal to the aforementioned upper limit.

Although the aforementioned components (A) to (H) are essential components of the present composition, other optional components include a reaction inhibitor, for example, alkyne alcohols such as 1-ethynyl-1-cyclohexanol, 2-methyl-3-butyn-2-ol, 3,5-dimethyl-1-hexyn-3-ol, 2-phenyl-3-butyn-2-ol, and the like; eneyne compounds such as 3-methyl-3-penten-1-yne, 3,5-dimethyl-3-hexen-1-yne; 1,3,5,7-tetramethyl-1,3,5,7-tetravinylcyclotetrasiloxane, 1,3,5,7-tetramethyl-1,3,5,7-tetrahexenylcyclotetrasiloxane, benzotriazole, and the like. Although no limitation is placed on the content of this reaction inhibitor, the content in the present composition, in terms of mass units, is preferably in a range from 1 to 5,000 ppm.

The present composition preferably includes an adhesion promoter in order to further improve adhesion to the substrate under contact during curing. This adhesion promoter is exemplified by: organosilanes or organosiloxane oligomers having about 4 to 20 silicon atoms and a linear, branched, or cyclic structure and having a trialkoxysiloxy group (e.g., trimethoxysiloxy group or triethoxysiloxy group) or trialkoxysilylalkyl group (e.g., trimethoxysilylethyl group or triethoxysilylethyl group) and a hydrosilyl group or alkenyl group (e.g., vinyl group or allyl group); organosilanes or organosiloxane oligomers having about 4 to 20 silicon atoms and a linear, branched, or cyclic structure and having a trialkoxysiloxy group or trialkoxysilylalkyl group and a methacryloxyalkyl group (e.g., 3-methacryloxypropyl group); organosilanes or organosiloxane oligomers having about 4 to 20 silicon atoms and a linear, branched, or cyclic structure and having a trialkoxysiloxy group or trialkoxysilylalkyl group and an epoxy group-bonded alkyl group (e.g., 3-glycidoxypropyl group, 4-glycidoxybutyl group, 2-(3,4-epoxycyclohexyl)ethyl group, or 3-(3,4-epoxycyclohexyl)propyl group); and products of reaction between aminoalkyltrialkoxysilanes and epoxy group-bonded alkyltrialkoxysilanes, and epoxy group-containing ethyl polysilicate. Specific examples of the adhesion promoter include: vinyltrimethoxysilane, allyltrimethoxysilane, allyltriethoxysilane, hydrogentriethoxysilane, 3-glycidoxypropyltrimethoxysilane, 3-glycidoxypropyltriethoxysilane, 2-(3,4-epoxycyclohexyl)ethyltrimethoxysilane, 3-methacryloxypropyltrimethoxysilane, 3-methacryloxypropyltriethoxysilane, products of reaction between 3-glycidoxypropyltriethoxysilane and 3-aminopropyltriethoxysilane, products of condensation reaction between silanol group-chain terminated methylvinylsiloxane oligomers and 3-glycidoxypropyltrimethoxysilane, products of condensation reaction between silanol group-chain terminated methylvinylsiloxane oligomers and 3-methacryloxypropyltriethoxysilane, and tris(3-trimethoxysilylpropyl) isocyanate.

As long as the object of the present invention is not impaired, other optional components may be included in the present composition. Such other optional components include organic resin powders of polymethacrylate resins, silicone resins, or the like; carnauba wax, metal stearate salts, methyl silicone oils, or the like mold release agents; and thermal stabilizers, flame retardants, solvents, or the like.

Although no particular limitation is placed on the viscosity of the present composition at 25° C., the viscosity is preferably in a range from 5 to 200 Pa·s, further is preferably in a range from 5 to 120 Pa·s, and particularly is preferably in a range from 10 to 80 Pa·s. The occurrence of flashing in the obtained molded product is suppressed when the viscosity is greater than or equal to the lower limit of the aforementioned range. Handling and processability of the obtained composition is good when viscosity is less than or equal to the upper limit of the aforementioned range.

Although no particular limitation is placed on the hardness of the cured product of the present invention, type D durometer hardness as specified by JIS K 7215-1986 "Testing Methods for Durometer Hardness of Plastics" is preferably greater than or equal to 60, further is preferably greater than or equal to 65, and particularly is preferably greater than or equal to 70. Dimensional stability of the cured product improves and resistance to deformation of the cured product increases when hardness is greater than or equal to the lower limit of the aforementioned range. Although no particular limitation is placed on the bending hardness of the cured product of the present composition, bending hardness as specified by JIS K 6911-1995 "General Testing Methods of Thermosetting Plastics" is preferably greater than or equal to 5 MPa, further is preferably greater than or equal to 7 MPa, and particularly preferably is greater than or equal to 10 MPa. Mechanical strength of the cured product is good, and the cured product becomes resistant to cracking or the like, when bending hardness is greater than or equal to the lower limit of the aforementioned range.

Although no particular limitation is placed on reflectance of the cured product of the present invention, total luminous reflectance as measured according to the method stipulated in JIS K 7375: 2008 "Plastics—Determination of Total Luminous Transmittance and Reflectance" is preferably greater than or equal to 80%, and particularly is preferably greater than or equal to 90%. Although no particular limitation is placed on the linear expansion coefficient of the cured product of the present composition, the linear expansion coefficient measured according to the method stipulated in JIS K 7197-1991 "Testing Method for Linear Thermal Expansion Coefficient of Plastics by Thermomechanical Analysis" in the temperature range of 25 to 200° C. has an average value that is preferably less than or equal to 200 ppm/° C., and particularly is preferably less than or equal to 150 ppm/° C.

Although the curing reaction of the present composition progresses at room temperature or by heating, the composition of the present invention is preferably heated to cause rapid curing. Heating temperature is preferably in a range from 50 to 200° C., and further is preferably in a range from 100 to 150° C. The molding method of the present composition is exemplified by transfer molding, injection molding, and compression molding.

The cured product of the present invention will be explained next in detail.

The cured product of the present invention is obtained by curing the aforementioned composition. The cured product of the present invention preferably has characteristics as described above.

The optical semiconductor device of the present invention will be explained next in detail.

The optical semiconductor device of the present invention is characterized by comprising: an optical semiconductor element, a light reflection material for reflecting light emitted from the element, and a sealing agent for sealing the element that contacts the light reflection material; wherein the light reflection material is formed by a cured product of the curable silicone composition. This type of optical semiconductor device is exemplified by a light emitting diode (LED). The light reflection material in this optical semiconductor device functions as a packaging material of the optical semiconductor device.

FIG. 1 shows a cross-sectional view of a surface mounted type LED, which is one example of the semiconductor device of the present invention. In the LED shown in FIG. 1, the optical semiconductor element 1 is die bonded to a lead frame 2 by a die bonding material, and lead frames 2,3 and this optical semiconductor element 1 are further wire bonded to the lead frame 2,3 by bonding wires 4,4'. At the periphery of this optical semiconductor element 1, with the exception of the upper part thereof, a light reflection material 5 composed of the cured product formed from the aforementioned curable silicone composition is present. The optical semiconductor element 1 within this light reflection material 5 is sealed by the sealing agent 6. This sealing agent is exemplified by silicone type and epoxy type sealing agents, and this sealing agent is preferably a silicone type sealing agent. This silicone type sealing agent is exemplified by methyl silicone type sealing agents manufactured by Dow Corning Toray Co., Ltd. (product names: OE-6370HF, EG-6301, OE-6351, and OE-6336) and phenylmethyl silicone type sealing agents manufactured by Dow Corning Toray Co., Ltd. (product names: OE-6630, OE-6635, OE-6665, and OE-6550).

The method of production of the surface mounted type LED shown in FIG. 1 is exemplified by a method including the steps of: (1) forming a light reflection material 5 integrated with the lead frames 2,3 by compression molding or transfer molding of the curable silicone composition, (2) die bonding of the optical semiconductor element 1 on the lead frame 2 using a die bonding material, (3) wire bonding the optical semiconductor element 1 and the lead frames 2,3 using bonding wires 4,4', and (4) sealing the optical semiconductor element 1 using the sealing agent 6.

EXAMPLES

The curable silicone composition, cured product thereof, and optical semiconductor device of the present invention will be explained in further detail using practical examples. Viscosity values in the examples are values at 25° C. Moreover, in the formulae, "Me", "Ph", and "Vi" respectively represent the methyl group, phenyl group, and vinyl group. Characteristics of the cured product were measured in the below described manner.

[Hardness]
Hardness of the cured product was measured by a type D durometer as specified in JIS K 7215-1986 "Testing Methods for Durometer Hardness of Plastics."

[Bending Strength]
Bending strength of the cured product was measured according to the method specified in JIS K 6911-1995 "General Testing Methods of Thermosetting Plastics."

[Total Luminous Reflectance]
Total luminous reflectance of the cured product was measured by the method specified in JIS K 7375:2008 "Plastics—Determination of Total Luminous Transmittance and Reflectance."

[Linear Expansion Coefficient]
Average linear expansion coefficient of the cured product in the temperature range of 25 to 200° C. was measured by the method specified in JIS K 7197-1991 "Testing Method for Linear Thermal Expansion Coefficient of Plastics by Thermomechanical Analysis."

Moreover, adhesion of the sealing agent of the light reflection material in the optical semiconductor device was evaluated in the following manner.

[Adhesion of the Sealing Agent to the Light Reflection Material]
By transfer molding at 120° C. using the curable silicone composition, a casing was formed from a light reflection material on a silver-plated lead frame. Thereafter, the cavity of each casing was filed using a sealing agent, the assembly was heated and cured for 2 hours at 150° C., and 20 of the optical semiconductor devices shown in FIG. 1 were produced. A methyl silicone type sealing agent manufactured by Dow Corning Toray Co., Ltd. (product name: OE-6370HF) or a phenylmethyl silicone type sealing agent manufactured by Dow Corning Toray Co., Ltd. (product name: OE-6630) was used as the sealing agent. After this optical semiconductor device was used for solder reflow testing for 30 seconds at 260° C., the bonded state of the sealing agent of the light reflection material was observed by red ink testing. That is to say, after 24 hours of immersion of the semiconductor device in red ink solution (INK-350-R, manufactured by Pilot Corporation), the optical semiconductor device was washed using water, and the presence or absence of penetration of ink into the contact interface between the light reflection material and the sealing agent was visually checked.

Practical Example 1

100 parts by mass of a methylvinylphenylpolysiloxane represented by the following average unit formula:

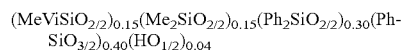

25 parts by mass of 1,3,5,7-tetramethyl-1,3,5,7-tetravinylcyclotetrasiloxane represented by the following formula:

50 parts by mass of 1,1,5,5-tetramethyl-3,3-diphenyltrisiloxane represented by the following formula:

in an amount that provides 0.81 moles of silicon atom-bonded hydrogen atoms in this component per 1 mole of the total amount of vinyl groups in the aforementioned methylvinylphenylpolysiloxane and 1,3,5,7-tetramethyl-1,3,5,7-tetravinylcyclotetrasiloxane, 6 parts by mass of 1,3,5,7-tetramethylcyclotetrasiloxane represented by the following formula:

in an amount that provides 0.25 moles of silicon atom-bonded hydrogen atoms in this component per 1 mole of the total amount of vinyl groups in the aforementioned methylvinylphenylpolysiloxane and 1,3,5,7-tetramethyl-1,3,5,7-tetravinylcyclotetrasiloxane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 100 parts by mass of titanium oxide having an average primary particle diameter of 0.2 μm (SX- 3103, manufactured by Sakai Chemical Industry Co., Ltd.), 135 parts by mass of crushed quartz powder having an average particle diameter of 5 μM (CRYSTALITE VX-52, manufactured by Tatsumori Ltd.), and 110 parts by mass of spherical silica having 15 μm average particle diameter (HS-202, manufactured by Nippon Steel & Sumikin Materials Co., Ltd.) were blended to prepare a curable silicone composition that had a viscosity of 32 Pa·s.

This composition was heated for 2 hours at 150° C. to form a cured product. This cured product had a type D durometer hardness of 78, a bending strength of 9.3 MPa, a total luminous reflectance of 94.7%, and a linear expansion coefficient of 115 ppm/° C. The optical semiconductor device shown in FIG. 1 was produced using this composition. Flashing and voids were not observed in this optical semiconductor device. No peeling was observed of the sealing agent from the light reflection material in optical semiconductor devices using either OE-6370HF or OE-6630 as the sealing agent materials.

Practical Example 2

100 parts by mass of a methylvinylphenylpolysiloxane represented by the following average unit formula:

$(MeViSiO_{2/2})_{0.25}(Ph_2SiO_{2/2})_{0.3}(PhSiO_{3/2})_{0.45}$
$(HO_{1/2})_{0.04}$ 37.5 parts by mass of phenyltris(dimethylvinylsiloxy)silane represented by the following formula:

$(ViMe_2SiO)_3SiPh$ 80 parts by mass of 1,1,5,5-tetramethyl-3,3-diphenyltrisiloxane represented by the following formula:

$(HMe_2SiO)_2SiPh_2$ in an amount that provides 0.89 moles of silicon atom-bonded hydrogen atoms in the present component per 1 mole of the total amount of vinyl groups in the aforementioned methylvinylphenylpolysiloxane and phenyltris(dimethylvinylsiloxy)silane, 10 parts by mass of a polysiloxane represented by the following formula:

$Me_3SiO(MeHSiO)_{12}SiMe_3$ in an amount that provides 0.37 moles of silicon atom-bonded hydrogen atoms in the present component per 1 mole of the total amount of vinyl groups in the aforementioned methylvinylphenylpolysiloxane and phenyltris(dimethylvinylsiloxy) silane, 1,3-divinyl-1,1,3,3-tetramethyldisiloxane solution of 1,3-divinyl-1,1,3,3-tetramethyldisiloxane complex of platinum in an amount that provides 3.5 ppm of platinum metal in terms of mass units in the present composition, 1-ethynyl-1-cyclohexanol in an amount that provides 200 ppm in terms of mass units in the present composition, 80 parts by mass of titanium oxide having an average primary particle diameter of 0.24 μm (TIPAQUE R-630, manufactured by Ishihara Sangyo Kaisha Ltd.), 65 parts by mass of crushed quartz powder having an average particle diameter of 5 μm (MIN-U-SIL #5, manufactured by Hayashi Kasei Co., Ltd.), and 135 parts by mass of spherical silica having 30 μm average particle diameter (FB-570, manufactured by Denki Kagaku Kogyo K.K.) were blended to prepare a curable silicone composition that had a viscosity of 9.2 Pa·s.

This composition was heated for 2 hours at 150° C. to form a cured product. This cured product had a type D durometer hardness of 80, a bending strength of 21 MPa, a total luminous reflectance of 94.5%, and a linear expansion coefficient of 94 ppm/° C. The optical semiconductor device shown in FIG. 1 was produced using this composition. Flashing and voids were not observed in this optical semiconductor device. No peeling was observed of the sealing agent from the light reflection material in optical semiconductor devices using either OE-6370HF or OE-6630 as the sealing agent materials.

Practical Example 3

100 parts by mass of a methylvinylphenylpolysiloxane represented by the following average unit formula:

$(MeViSiO_{2/2})_{0.10}(Me_2SiO_{2/2})_{0.15}(PhSiO_{3/2})_{0.75}$
$(HO_{1/2})_{0.01}$ 37.5 parts by mass of tetrakis(dimethylvinylsiloxy)silane represented by the following formula:

$(ViMe_2SiO)_4Si$ 70 parts by mass of 1,1,5,5-tetramethyl-3,3-diphenyltrisiloxane represented by the following formula:

$(HMe_2SiO)_2SiPh_2$ in an amount that provides 0.84 moles of silicon atom-bonded hydrogen atoms in the present component per 1 mole of the total amount of vinyl groups in the aforementioned methylvinylphenylpolysiloxane and tetrakis(dimethylvinylsiloxy)silane, 15 parts by mass of a polysiloxane represented by the following formula:

$Me_3SiO(MeHSiO)_{30}(Me_2SiO)_{30}SiMe_3$ in an amount that provides 0.31 moles of silicon atom-bonded hydrogen atoms in the present component per 1 mole of the total amount of vinyl groups in the aforementioned methylvinylphenylpolysiloxane and tetrakis(dimethylvinylsiloxy)silane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 80 parts by mass of titanium oxide having an average primary particle diameter of 0.24 μm (TIPAQUE R-630, manufactured by Ishihara Sangyo Kaisha Ltd.), 65 parts by mass of milled glass fiber having 20 μm average cut length and 3 μm average fiber diameter (MF03JB 1-20, manufactured by Asahi Fiber Glass Co., Ltd.), and 135 parts by mass of spherical silica having 15 μm average particle diameter (HS-202, manufactured by Nippon Steel & Sumikin Materials Co., Ltd.) were blended to prepare a curable silicone composition that had a viscosity of 7.7 Pa·s.

This composition was heated for 2 hours at 150° C. to form a cured product. This cured product had a type D durometer hardness of 77, a bending strength of 8.3 MPa, a total luminous reflectance of 94.6%, and a linear expansion coefficient of 123 ppm/° C. The optical semiconductor device shown in FIG. 1 was produced using this composition. Flashing and voids were not observed in this optical semiconductor device. Although peeling was not observed for the sealing agent from the light reflection material when OE-6370HF was used as the sealing agent of the optical semiconductor device, in 2 out of 20 optical semiconductor devices, peeling of the sealing agent from the light reflection material was observed when OE-6630 was used as the sealing agent.

Practical Example 4

100 parts by mass of a methylvinylphenylpolysiloxane represented by the following average unit formula:

$(Me_2ViSiO_{1/2})_{0.20}(PhSiO_{3/2})_{0.80}(HO_{1/2})_{0.02}$ 8 parts by mass of 1,3,5,7-tetramethyl-1,3,5,7-tetravinylcyclotetrasiloxane represented by the following formula:

(MeViSiO)$_4$ 20 parts by mass of a dimethylvinylsiloxy-terminated polymethylphenylsiloxane represented by the following formula:

ViMe$_2$SiO(MePhSiO)$_{17.5}$SiViMe$_2$ 30 parts by mass of 1,1,5,5-tetramethyl-3,3-diphenyltrisiloxane represented by the following formula:

(HMe$_2$SiO)$_2$SiPh$_2$ in an amount that provides 0.66 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, 2.5 parts by mass of a silicon atom-bonded hydrogen atom-containing methylphenylpolysiloxane represented by the following average unit formula:

(Me$_2$HSiO$_{1/2}$)$_{0.6}$(PhSiO$_{3/2}$)$_{0.4}$ in an amount that provides 0.06 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, 3.5 parts by mass of 1,3,5,7-tetramethylcyclotetrasiloxane represented by the following formula:

(MeHSiO)$_4$ in an amount that provides 0.50 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, 1,3-divinyl-1,1,3,3-tetramethyldisiloxane solution of 1,3-divinyl-1,1,3,3-tetramethyldisiloxane complex of platinum in an amount that provides 5 ppm of the platinum metal in terms of mass units in the present composition, 1-ethynyl-1-cyclohexanol in an amount that provides 250 ppm in terms of mass units in the present composition, 110 parts by mass of titanium oxide having an average primary particle diameter of 0.2 μm (SX-3103, manufactured by Sakai Chemical Industry Co., Ltd.), 100 parts by mass of crushed quartz powder having an average particle diameter of 5 μm (SILICIC SAB-500, manufactured by Yamamori Tsuchimoto Mining Co., Ltd.), and 180 parts by mass of spherical silica having 15 μm average particle diameter (HS-202, manufactured by Nippon Steel & Sumikin Materials Co., Ltd.) were blended to prepare a curable silicone composition that had a viscosity of 89 Pa·s.

This composition was heated for 2 hours at 150° C. to form a cured product. This cured product had a type D durometer hardness of 85, a bending strength of 19 MPa, a total luminous reflectance of 95.6%, and a linear expansion coefficient of 76 ppm/° C. The optical semiconductor device shown in FIG. 1 was produced using this composition. Flashing and voids were not observed in this optical semiconductor device. No peeling was observed of the sealing agent from the light reflection material in optical semiconductor devices using either OE-6370HF or OE-6630 as the sealing agent materials.

Comparative Example 1

100 parts by mass of a methylvinylphenylpolysiloxane represented by the following average unit formula:

(MeViSiO$_{2/2}$)$_{0.15}$(Me$_2$SiO$_{2/2}$)$_{0.15}$(Ph$_2$SiO$_{2/2}$)$_{0.30}$(PhSiO$_{3/2}$)$_{0.40}$(HO$_{1/2}$)$_{0.04}$ 25 parts by mass of 1,3,5,7-tetramethyl-1,3,5,7-tetravinylcyclotetrasiloxane represented by the following formula:

(MeViSiO)$_4$ 56 parts by mass of 1,1,5,5-tetramethyl-3,3-diphenyltrisiloxane represented by the following formula:

(HMe$_2$SiO)$_2$SiPh$_2$ in an amount that provides 0.91 moles of silicon atom-bonded hydrogen atoms in the present component per 1 mole of the total amount of vinyl groups in the aforementioned methylvinylphenylpolysiloxane and 1,3,5,7-tetramethyl-1,3,5,7-tetravinylcyclotetrasiloxane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 100 parts by mass of titanium oxide having an average primary particle diameter of 0.2 μm (SX-3103, manufactured by Sakai Chemical Industry Co., Ltd.), 135 parts by mass of crushed quartz powder having an average particle diameter of 5 μm (CRYSTALITE VX-52, manufactured by Tatsumori Ltd.), and 110 parts by mass of spherical silica having 15 μm average particle diameter (HS-202, manufactured by Nippon Steel & Sumikin Materials Co., Ltd.) were blended to prepare a curable silicone composition that had a viscosity of 39 Pa·s.

This composition was heated for 2 hours at 150° C. to form a cured product. This cured product had a type D durometer hardness of 75, a bending strength of 7.0 MPa, a total luminous reflectance of 94.5%, and a linear expansion coefficient of 121 ppm/° C. The optical semiconductor device shown in FIG. 1 was produced using this composition. Flashing and voids were not observed in this optical semiconductor device. In 5 of 20 optical semiconductor devices produced by using OE-6370HF as the sealing agent, peeling of the sealing agent from the light reflection material was observed. In all 20 optical semiconductor devices produced by using OE-6630 as the sealing agent, peeling of the sealing agent from the light reflection material was observed.

Comparative Example 2

100 parts by mass of a methylvinylphenylpolysiloxane represented by the following average unit formula:

(MeViSiO$_{2/2}$)$_{0.25}$(Ph$_2$SiO$_{2/2}$)$_{0.3}$(PhSiO$_{3/2}$)$_{0.45}$(HO$_{1/2}$)$_{0.04}$ 37.5 parts by mass of phenyltris(dimethylvinylsiloxy)silane represented by the following formula:

(ViMe$_2$SiO)$_3$SiPh 87 parts by mass of 1,1,5,5-tetramethyl-3,3-diphenyltrisiloxane represented by the following formula:

(HMe$_2$SiO)$_2$SiPh$_2$ in an amount that provides 0.97 moles of silicon atom-bonded hydrogen atoms in the present component per 1 mole of the total amount of vinyl groups in the aforementioned methylvinylphenylpolysiloxane and phenyltris(dimethylvinylsiloxy)

silane, 10 parts by mass of a silicon atom-bonded hydrogen atom-containing methylphenylpolysiloxane represented by the following average unit formula:

$(Me_2HSiO_{1/2})_{0.6}(PhSiO_{3/2})_{0.4}$ in an amount that provides 0.12 moles of silicon atom-bonded hydrogen atoms in the present component per 1 mole of the total amount of vinyl groups in the aforementioned methylvinylphenylpolysiloxane and phenyltris(dimethylvinylsiloxy)silane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 80 parts by mass of titanium oxide having an average primary particle diameter of 0.24 μm (TIPAQUE R-630, manufactured by Ishihara Sangyo Kaisha Ltd.), 65 parts by mass of crushed quartz powder having an average particle diameter of 5 μm (MIN-U-SIL #5, manufactured by Hayashi Kasei Co., Ltd.), and 135 parts by mass of spherical silica having 30 μm average particle diameter (FB-570, manufactured by Denki Kagaku Kogyo K.K.) were blended to prepare a curable silicone composition that had a viscosity of 9.4 Pa·s.

This composition was heated for 2 hours at 150° C. to form a cured product. This cured product had a type D durometer hardness of 80, a bending strength of 21 MPa, a total luminous reflectance of 94.5%, and a linear expansion coefficient of 94 ppm/° C. The optical semiconductor device shown in FIG. 1 was produced using this composition. Flashing and voids were not observed in this optical semiconductor device. In 7 of 20 optical semiconductor devices produced by using OE-6370HF as the sealing agent, peeling of the sealing agent from the light reflection material was observed. In all 20 optical semiconductor devices produced by using OE-6630 as the sealing agent, peeling of the sealing agent from the light reflection material was observed.

Comparative Example 3

100 parts by mass of a methylvinylphenylpolysiloxane represented by the following average unit formula:

$(MeViSiO_{2/2})_{0.10}(Me_2SiO_{2/2})_{0.15}(PhSiO_{3/2})_{0.75}(HO_{1/2})_{0.01}$ 37.5 parts by mass of tetrakis(dimethylvinylsiloxy)silane represented by the following formula:

$(ViMe_2SiO)_4Si$ 70 parts by mass of 1,1,5,5-tetramethyl-3,3-diphenyltrisiloxane represented by the following formula:

$(HMe_2SiO)_2SiPh_2$ in an amount that provides 0.84 moles of silicon atom-bonded hydrogen atoms in the present component per 1 mole of the total amount of vinyl groups in the aforementioned methylvinylphenylpolysiloxane and tetrakis(dimethylvinylsiloxy)silane, 25 parts by mass of a polysiloxane represented by the following formula:

$Me_3SiO(MeHSiO)_{20}(Me_2SiO)_{40}SiMe_3$ in an amount that provides 0.32 moles of silicon atom-bonded hydrogen atoms in the present component per 1 mole of the total amount of vinyl groups in the aforementioned methylvinylphenylpolysiloxane and tetrakis(dimethylvinylsiloxy)silane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 80 parts by mass of titanium oxide having an average primary particle diameter of 0.24 μM (TIPAQUE R-630, manufactured by Ishihara Sangyo Kaisha Ltd.), 65 parts by mass of milled glass fiber having 20 μm average cut length and 3 μm average fiber diameter (MF03JB 1-20, manufactured by Asahi Fiber Glass Co., Ltd.), and 135 parts by mass of spherical silica having 15 μM average particle diameter (HS-202, manufactured by Nippon Steel & Sumikin Materials Co., Ltd.) were blended to prepare a curable silicone composition that had a viscosity of 7.5 Pa·s.

This composition was heated for 2 hours at 150° C. to form a cured product. This cured product had a type D durometer hardness of 75, a bending strength of 7.6 MPa, a total luminous reflectance of 94.5%, and a linear expansion coefficient of 120 ppm/° C. The optical semiconductor device shown in FIG. 1 was produced using this composition. Although flashing and voids were not observed in this optical semiconductor device, partial cracking was observed. In 3 of 20 optical semiconductor devices produced by using OE-6370HF as the sealing agent, peeling of the sealing agent from the light reflection material was observed. In 17 of 20 optical semiconductor devices produced by using OE-6630 as the sealing agent, peeling of the sealing agent from the light reflection material was observed.

Comparative Example 4

100 parts by mass of a methylvinylphenylpolysiloxane represented by the following average unit formula:

$(Me_2ViSiO_{1/2})_{0.20}(PhSiO_{3/2})_{0.80}(HO_{1/2})_{0.02}$ 8 parts by mass of 1,3,5,7-tetramethyl-1,3,5,7-tetravinylcyclotetrasiloxane represented by the following formula:

$(MeViSiO)_4$ 20 parts by mass of a dimethylvinylsiloxy-terminated polymethylphenylsiloxane represented by the following formula:

$ViMe_2SiO(MePhSiO)_{17.5}SiViMe_2$ 40 parts by mass of 1,1,5,5-tetramethyl-3,3-diphenyltrisiloxane represented by the following formula:

$(HMe_2SiO)_2SiPh_2$ in an amount that provides 0.88 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, 5 parts by mass of a silicon atom-bonded hydrogen atom-containing methylphenylpolysiloxane represented by the following average unit formula:

$(Me_2HSiO_{1/2})_{0.6}(PhSiO_{3/2})_{0.4}$ in an amount that provides 0.12 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, 1.0 parts by mass of 1,3,5,7-tetramethylcyclotetrasiloxane represented by the following formula:

$(MeHSiO)_4$ in an amount that provides 0.14 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, 1,3-divinyl-1,1,3,3-tetramethyldisiloxane solution of 1,3-divinyl-1,1,3,3-tetramethyldisiloxane complex of platinum in an amount that provides 5 ppm of the platinum metal in terms of mass units in the present composition, 1-ethynyl-1-cyclohexanol in an amount that provides 250 ppm in terms of mass units in the present composition, 110 parts by mass of titanium oxide having an average primary particle diameter of 0.2 μm (SX-3103, manufactured by Sakai Chemical Industry Co., Ltd.), 100 parts by mass of crushed quartz powder having an average particle diameter of 5 μm (SILICIC SAB-500, manufactured by Yamamori Tsuchimoto Mining Co., Ltd.), and 250 parts by mass of spherical silica having 15 μm average particle diameter (HS-202, manufactured by Nippon Steel & Sumikin Materials Co., Ltd.) were blended to prepare a curable silicone composition that had a viscosity of 97 Pa·s.

This composition was heated for 2 hours at 150° C. to form a cured product. This cured product had a type D durometer hardness of 85, a bending strength of 19 MPa, a total luminous reflectance of 95.5%, and a linear expansion coefficient of 75 ppm/° C. The optical semiconductor device shown in FIG. 1 was produced using this composition. Flashing and voids were not observed in this optical semiconductor device. In 7 of 20 optical semiconductor devices produced by using OE-6370HF as the sealing agent, peeling of the sealing agent from the light reflection material was observed. In all 20 optical semiconductor devices produced by using OE-6630 as the sealing agent, peeling of the sealing agent from the light reflection material was observed.

Comparative Example 5

100 parts by mass of a methylvinylphenylpolysiloxane represented by the following average unit formula:

(Me$_2$ViSiO$_{1/2}$)$_{0.20}$(PhSiO$_{3/2}$)$_{0.80}$(HO$_{1/2}$)$_{0.02}$ 8 parts by mass of 1,3,5,7-tetramethyl-1,3,5,7-tetravinylcyclotetrasiloxane represented by the following formula:

(MeViSiO)$_4$ 20 parts by mass of a dimethylvinylsiloxy-terminated polymethylphenylsiloxane represented by the following formula:

ViMe$_2$SiO(MePhSiO)$_{17.5}$SiViMe$_2$ 20 parts by mass of 1,1,5,5-tetramethyl-3,3-diphenyltrisiloxane represented by the following formula:

(HMe$_2$SiO)$_2$SiPh$_2$ in an amount that provides 0.66 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, 6 parts by mass of 1,3,5,7-tetramethyl cyclotetrasiloxane represented by the following formula:

(MeHSiO)$_4$ in amount that provides 0.88 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, 1,3-divinyl-1,1,3,3-tetramethyldisiloxane solution of 1,3-divinyl-1,1,3,3-tetramethyldisiloxane complex of platinum in an amount that provides 5 ppm of the platinum metal in terms of mass units in the present composition, 1-ethynyl-1-cyclohexanol in an amount that provides 250 ppm in terms of mass units in the present composition, 110 parts by mass of titanium oxide having an average primary particle diameter of 0.2 μm (SX-3103, manufactured by Sakai Chemical Industry Co., Ltd.), 100 parts by mass of crushed quartz powder having an average particle diameter of 5 μm (SILICIC SAB-500, manufactured by Yamamori Tsuchimoto Mining Co., Ltd.), and 250 parts by mass of spherical silica having 15 μM average particle diameter (HS-202, manufactured by Nippon Steel & Sumikin Materials Co., Ltd.) were blended to prepare a curable silicone composition that had a viscosity of 80 Pa·s.

This composition was heated for 2 hours at 150° C. to form a cured product. This cured product had a type D durometer hardness of 90, a bending strength of 8.2 MPa, a total luminous reflectance of 95.3%, and a linear expansion coefficient of 70 ppm/° C. The optical semiconductor device shown in FIG. 1 was produced using this composition. Although flashing and voids were not observed in this optical semiconductor device, partial cracking was observed. Although peeling was not observed for the sealing agent from the light reflection material when OE-6370HF was used as the sealing agent of the optical semiconductor device, in 6 out of 20 optical semiconductor devices, peeling of the sealing agent from the light reflection material was observed when OE-6630 was used as the sealing agent.

INDUSTRIAL APPLICABILITY

The curable silicone composition of the present invention has good formability and forms a cured product that is resistant to the occurrence of discoloration and lowering of mechanical strength by heat and light. Adhesion to this cured product by the sealing agent used for a semiconductor device is good, and thus the curable silicone composition of the present invention is suitable as a material for the white casing material of a light emitting diode.

DESCRIPTION OF SYMBOLS 1 optical semiconductor element
2 lead frame
3 lead frame
4, 4' bonding wire
5 light reflection material composed of cured silicone
6 sealing agent

The invention claimed is:
1. A curable silicone composition comprising:
(A) 100 parts by mass of an organopolysiloxane represented by the following average unit formula:

(R$^1_3$SiO$_{1/2}$)$_a$(R$^1_2$SiO$_{2/2}$)$_b$(R$^1$SiO$_{3/2}$)$_c$(SiO$_{4/2}$)$_d$(R$^2$O$_{1/2}$)$_e$ wherein R$^1$ are independently the same or different, and are phenyl groups, alkyl groups having from 1 to 6 carbons, or alkenyl groups having from 2 to 6 carbons, provided that 30 to 80 mole % of all R$^1$ are phenyl groups, and 5 to 20 mole % of all R$^1$ are alkenyl groups; R$^2$ is a hydrogen atom or alkyl group having from 1 to 6 carbons; and a, b, c, d, and e are numbers that respectively satisfy: $0 \leq a \leq 0.3$, $0 \leq b \leq 0.7$, $0.3 \leq c \leq 0.9$, $0 \leq d \leq 0.1$, $0 \leq e \leq 0.1$, and a+b+c+d=1;
(B) 5 to 50 parts by mass of an organopolysiloxane having 10 or less silicon atoms, wherein 30 to 60 mole % of all silicon atom-bonded organic groups in the (B) component are alkenyl groups having from 2 to 6 carbons;

(c) 0 to 40 parts by mass of an organopolysiloxane represented by the following general formula:

$$R^3_3SiO(R^3_2SiO)_m SiR^3_3$$

wherein $R^3$ are independently the same or different, and are phenyl groups, alkyl groups having from 1 to 6 carbons, or alkenyl groups having from 2 to 6 carbons, provided that 30 to 70 mole % of all $R^3$ are phenyl groups, and at least one $R^3$ is an alkenyl group; and m is an integer in a range from 10 to 100;

(D) an organopolysiloxane having at least 2 silicon atom-bonded hydrogen atoms in a molecule, wherein the content of phenyl groups in all silicon atom-bonded organic groups in this component is at least 20 mole %, in an amount that provides 0.3 to 1.5 moles of the silicon atom-bonded hydrogen atoms in the (D) component per 1 mole of the total amount of alkenyl groups in components (A) to (C);

(E) an organopolysiloxane having at least 2 silicon atom-bonded hydrogen atoms in a molecule, wherein the content of phenyl groups in all silicon atom-bonded organic groups in the (E) component is less than 20 mole %, in an amount that provides 0.2 to 0.8 moles of the silicon atom-bonded hydrogen atoms in the (E) component per 1 mole of the total amount of alkenyl groups in components (A) to (C);

(F) a hydrosilylation reaction catalyst in an amount sufficient to accelerate a hydrosilylation reaction between the alkenyl groups in components (A) to (C) and the silicon atom-bonded hydrogen atoms in components (D) and (E);

(G) a white pigment in an amount of at least 25 parts by mass per 100 parts by mass of the total amount of components (A) to (F); and (H) an inorganic filler other than a white pigment in an amount of at least 40 parts by mass per 100 parts by mass of the total amount of components (A) to (F), wherein the content of the total amount of components (G) and (H) is not more than 300 parts by mass per 100 parts by mass of the total amount of components (A) to (F).

2. The curable silicone composition according to claim 1, wherein component (D) is an organopolysiloxane in which 20 to 70 mole % of all silicon atom-bonded organic groups are phenyl groups.

3. The curable silicone composition according to claim 1, wherein component (E) is an organopolysiloxane in which 90 mole % or more of all silicon atom-bonded organic groups are methyl groups.

4. The curable silicone composition according to claim 1, wherein the total amount of the silicon atom-bonded hydrogen atoms in components (D) and (E) per 1 mole of the total amount of alkenyl groups in components (A) to (C) is from 0.5 to 2.0 moles.

5. The curable silicone composition according to claim 1, wherein a viscosity at 25° C. is from 5 to 200 Pa·s.

6. The curable silicone composition according to claim 1, wherein the curable silicone composition cures to form a cured product having a type D durometer hardness greater than or equal to 60, and a bending strength greater than or equal to 5 MPa.

7. The curable silicone composition according to claim 1, wherein the curable silicone composition cures to form a cured product having a total luminous reflectance greater than or equal to 80%.

8. The curable silicone composition according to claim 1, wherein the curable silicone composition cures to form a cured product having an average coefficient of linear expansion in a temperature range of 25 to 200° C. less than or equal to 200 ppm/° C.

9. A cured product produced by curing the curable silicone composition according to claim 1.

10. An optical semiconductor device comprising: an optical semiconductor element; a light reflection material for reflecting light emitted from the element; and a sealing agent for sealing the element that contacts the light reflection material, wherein the light reflection material is formed by a cured product of the curable silicone composition according to claim 1.

* * * * *